United States Patent
Gao et al.

(10) Patent No.: US 9,404,979 B2
(45) Date of Patent: Aug. 2, 2016

(54) POWER SUPPLY UNIT TESTING SYSTEM

(71) Applicant: ShenZhen Goldsun Network Intelligence Technology Co., Ltd., ShenZhen (CN)

(72) Inventors: Zhi-Yong Gao, Wuhan (CN); Yu-Lin Liu, Wuhan (CN)

(73) Assignee: ShenZhen Goldsun Network Intelligence Technology Co., Ltd., Shenzhen (CN)

( * ) Notice: Subject to any disclaimer, the term of this patent is extended or adjusted under 35 U.S.C. 154(b) by 840 days.

(21) Appl. No.: 13/726,150

(22) Filed: Dec. 23, 2012

(65) Prior Publication Data

US 2013/0249576 A1 Sep. 26, 2013

(51) Int. Cl.
*G01R 31/00* (2006.01)
*G01R 31/40* (2014.01)
*G01R 31/319* (2006.01)

(52) U.S. Cl.
CPC .......... *G01R 31/40* (2013.01); *G01R 31/31924* (2013.01)

(58) Field of Classification Search
CPC ................ G01R 31/31924; G01R 31/31922; G01R 31/31937; G01R 31/40; G01R 31/31721; G01R 31/42; G01R 31/3191; G01R 31/2886; G01R 31/2805; G01R 31/024; G01R 31/2812; G01R 31/2884; G01R 31/2853; G01R 19/16538; G01R 31/2827; G01R 31/327; G01R 31/3271–31/3274
USPC .......... 324/764.01, 750.01, 750.02, 537, 771; 323/282, 351
See application file for complete search history.

(56) References Cited

U.S. PATENT DOCUMENTS

| | | | | |
|---|---|---|---|---|
| 7,196,485 B1* | 3/2007 | Lee | ......................... | F24F 7/007 318/139 |
| 7,205,733 B2* | 4/2007 | Xiong | ................... | H02P 7/2885 318/400.11 |
| 7,279,947 B2* | 10/2007 | Chiu | ........................ | H03K 7/08 327/172 |
| 7,479,753 B1* | 1/2009 | Mimberg | .................. | H02P 7/29 318/254.2 |
| 8,193,746 B2* | 6/2012 | Jimenez Pino | ....... | B60N 2/0232 318/268 |
| 2001/0024093 A1* | 9/2001 | Naganuma | ........... | H02H 7/0851 318/445 |
| 2008/0304297 A1* | 12/2008 | Hsieh | ...................... | H02M 1/36 363/50 |
| 2011/0090604 A1* | 4/2011 | Butler | ....................... | H03F 1/52 361/18 |
| 2011/0140725 A1* | 6/2011 | Xie | ......................... | G01R 31/40 324/750.3 |

* cited by examiner

*Primary Examiner* — Bot LeDynh
*Assistant Examiner* — Thang Le
(74) *Attorney, Agent, or Firm* — ScienBiziP, P.C.

(57) ABSTRACT

A system for testing a PSU includes an input control module, a voltage regulating module, and a load adjusting module. The input control module includes a microcontroller and a plurality of key switches connected to the microcontroller. The microcontroller is configured to receive input instruction from the plurality of key switches and output a control signal according to the input instruction. The voltage regulating module is configured to receive the control signal and generate an output voltage with a voltage value associated with the control signal. The load adjusting module includes a motor coupled to the output voltage of the voltage regulating module. The motor is rotatable in opposite direction to adjust an output current of the PSU. A rotating speed of the motor is in direct proportion to the voltage value of the output voltage.

20 Claims, 2 Drawing Sheets

POWER SUPPLY UNIT TESTING SYSTEM

BACKGROUND

1. Technical Field

The present disclosure relates to a power supply unit (PSU) testing system.

2. Description of Related Art

Many personal computers utilize a PSU for providing direct current (DC) power sources (e.g., 3V, 5V, 12V, etc.) to components thereof. The PSU usually has an over current protection (OCP) function to detect whether an output current to each of the components exceeds a preset tolerance value. If the output current exceeds the preset tolerance value, the PSU is automatically powered off to protect the components.

In order to provide users with qualified PSUS, the PSUS should pass OCP test. In typical OCP test systems, each PSU is connected to an electric load. The electric load has a knob to adjust a resistance value of the electric load. An operator should operate the knob to steadily decrease resistance of the load, thus increasing current flowing to the load. However, it's inefficient to adjust the resistance value of the electric load manually.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings, like references indicate similar elements. It should be noted that references to "an" or "one" embodiment in this disclosure are not necessarily to the same embodiment, and such references mean "at least one."

Figure 1:
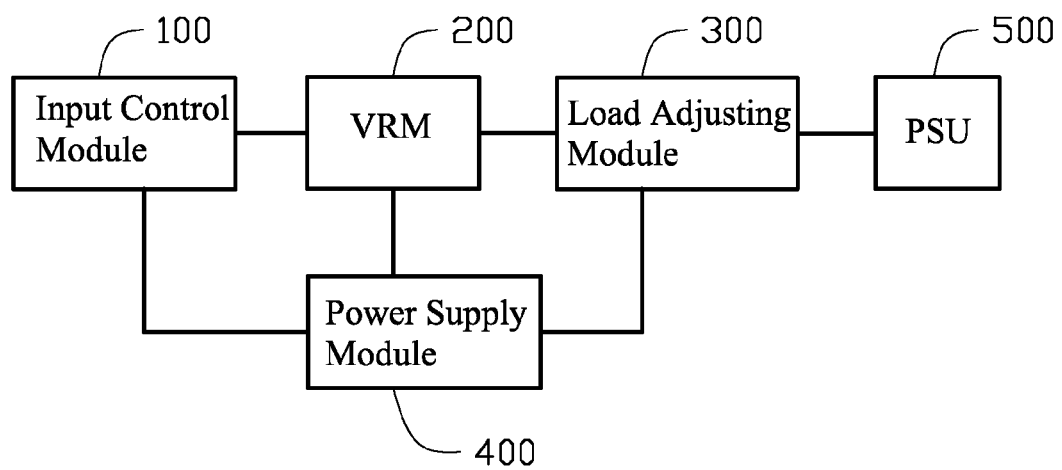
FIG. 1 is a block diagram of a power supply testing system in accordance with an embodiment.

FIG. 1 shows that an embodiment of a testing system is configured to perform an OCP test on a power supply unit (PSU) 500. The testing system includes an input control module 100, a voltage regulation module (VRM) 200, a load adjusting module 300, and a power supply module 400. The power supply module is configured to supply working voltages to the input control module 100, the VRM 200, and the load adjusting module 300. The input control module 100 is configured to receive input signals and control an output voltage of the VRM 200 according to the input signals. The load adjusting module 300 includes a rotating means which rotates under the output voltage of the VRM 200. A rotating speed of the rotating means is in direct proportion to a value of the output voltage of the VRM 200. In one embodiment, the PSU 500 is connected to an electric load with a knob (not shown). The rotating means is connected to the knob and adjust a resistance value of the electric load.

Figure 2:
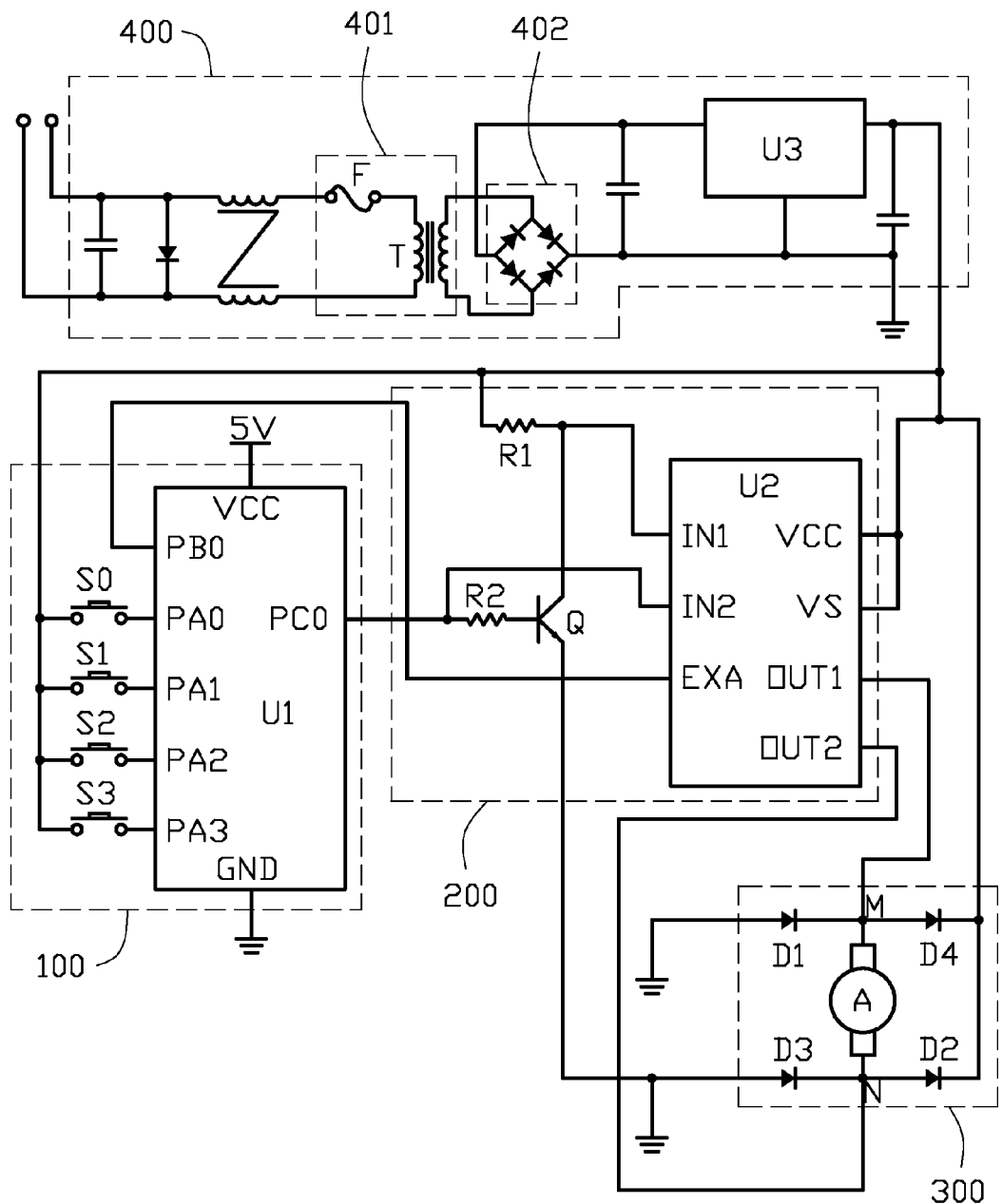
FIG. 2 is a detailed circuit of the power supply testing system of FIG. 1.

FIG. 2 shows that the input control module 100 includes a microcontroller U1 and key switches S0~S3 connected to the microcontroller U1. The microcontroller U1 includes signal input pins PA0~PA3 respectively connected to the key switches S0~S3, signal output pins PB0 and PC0, a VCC pin connected with a DC power source (e.g., 5V), and a GND pin connected to ground. The DC power source may be supplied from the power supply module 400. The pin PB0 is configured to output a pulse width modulation (PWM) signal to the VRM 200. The pin PC0 is configured to output a low level or high level control signal to the VRM 200. In one embodiment, the microcontroller 500 is an AT mega 16 microcontroller chip.

The VRM 200 includes a transistor Q1, a first resistor R1, a second resistor R2, and a voltage regulation chip U2. A first end of the first resistor R1 is connected to a voltage output terminal of the power supply module 400. A second end of the first resistor R1 is connected to a pin IN1 of the voltage regulation chip U2. A base terminal of the transistor Q1 is connected to the pin PC0 of the microcontroller U1 via the second resistor R2. A collector terminal of the transistor Q1 is connected to the pin IN1 of the voltage regulation chip U2. An emitter terminal of the transistor Q1 is connected to ground. A pin EXA of the voltage regulation chip U2 is connected to the pin PB0 of the microcontroller U1. Pins VCC and VS of the voltage regulation chip U2 both connect to the voltage output terminal of the power supply module 400. Pins OUT1 and OUT2 are connected to the load adjusting module 300. In one embodiment, the transistor is an NPN type bipolar transistor. The voltage regulation chip U2 is an L298N chip.

The load adjusting module 300 includes a motor A and light emitting diodes (LEDS) D1~D4. A first terminal of the motor A is connected to a node M. A second terminal of the motor A is connected to a node N. The pin OUT1 of the voltage regulation chip U2 is connected to the node M. The pin OUT2 of the voltage regulation chip U2 is connected to the node N. An anode of the LED D1 is connected to ground. A cathode of the LED D1 is connected to the node M. An anode of the LED D2 is connected to the node N. A cathode of the LED D2 is connected to the voltage output terminal of the power supply module 400. An anode of the LED D3 is connected to ground. A cathode of the LED D3 is connected to the node N. An anode of the LED D4 is connected to the node M. A cathode of the LED D4 is connected to the voltage output terminal of the power supply module 400.

The power supply module 400 includes a voltage drop circuit 401, a bridge rectifier 402, and a voltage stabilization chip U3. The voltage drop circuit 401 includes a fuse F and a voltage transformer T connected to the fuse F. The bridge rectifier 402 includes four diodes. The voltage drop circuit 401 is coupled to an alternating current (AC) power source (e.g., AC 220V) and drops the 220V AC voltage to a dropped AC voltage (e.g., AC 16V). The bridge rectifier 402 converts the dropped AC voltage to a DC voltage (e.g., DC 16V). The voltage stabilization chip U3 receives the DC voltage from the bridge rectifier 402 and outputs a stabilized DC voltage via the voltage output terminal.

Users can use the key switches S0~S2 to input instructions to the microcontroller U1 and control the PWM signal output by the PB0 pin of the microcontroller U1. The PWM signal can control a voltage output by the voltage regulation chip U2 and indirectly control a rotating speed of the motor A. When the motor A is rotated, a resistance value of the electric load varies, and an output current of the PSU 500 varies. Thus, an OCP function of the PSU 500 can be tested. In one embodiment, when the key switch S0 is pressed, a current decreasing rate of the PSU 500 is 10 ampere per second (A/S). When the key switch S1 is pressed, the current decreasing rate of the PSU 500 is 1 A/S. When the key switches S2 is pressed, the current decreasing rate of the PSU 500 is 0.1 A/S. When the key switch S3 is pressed, the motor A rotates back to its original position, and the output current of the PSU 500 resumes to an original value.

In one example detailed as follows, when one of the key switches S0~S2 is pressed, the PB0 of the microcontroller U1 outputs a corresponding PWM signal to the pin EXA of the voltage regulation chip U2. The PC0 pin of the microcontroller U1 outputs a low level signal to the base terminal of the transistor Q via the second resistor R2. The transistor Q is rendered non-conductive and switched off. The pin IN1 of the voltage regulation chip U2 is at high level. The pin IN2 of the voltage regulation chip U2 is at low level. The pin OUT1 of the voltage regulation module U2 is at high level. The pin OUT2 of the voltage regulation module U2 is at low level. The motor A rotates in a clockwise direction under the voltage output by the voltage regulation chip U2 for adjusting the output current of the PSU 500.

When the key switch S3 is pressed, the PC0 pin of the microcontroller U1 outputs a high level signal to the base terminal of the transistor Q via the second resistor R2. The transistor Q is rendered conductive and switched on. The pin IN1 of the voltage regulation chip U2 is at low level. The pin IN2 of the voltage regulation chip U2 is at high level. The pin OUT1 of the voltage regulation module U2 is at low level. The pin OUT2 of the voltage regulation module U2 is at high level. The motor A rotates back in a counter-clockwise direction until the knob of the electric load returns to its original position. The PSU 500 can be tested for another time after the key switch S3 is pressed.

In one embodiment, when the motor A rotates in the clockwise direction, LEDS D3 and D4 are power on, and LEDS D1 and D1 are power off. When the motor A rotates in the counter-clockwise direction, LEDS D1 and D1 are power on, and LEDS D3 and D4 are power off.

While the present disclosure has been illustrated by the description in this embodiment, and while the embodiment has been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A system for testing a PSU, comprising:
   an input control module comprising a microcontroller and a key switch assembly connected to the microcontroller, the microcontroller is configured to receive input instruction from the key switch assembly and output a PWM signal according to the input instruction;
   a voltage regulating module configured to receive the PWM signal and generate an output voltage with a voltage value associated with the PWM signal;
   a load adjusting module comprising a motor coupled to the output voltage of the voltage regulating module, the motor is rotatable in opposite direction to adjust an output current of the PSU, and a rotating speed of the motor is in direct proportion to the voltage value of the output voltage.

2. The system of claim 1, wherein the key switch assembly comprises a first key configured to set a first test current of the PSU, a second key switch configured to set a second test current of the PSU, and a third key switch configured to set a third test current of the PSU.

3. The system of claim 2, wherein the key switch assembly further comprises a reset key switch connected to the microcontroller.

4. The system of claim 3, wherein when one of the first key switch, the second key switch, and the third key switch is activated, the motor is rotated in a first direction; and when the reset key switch is activated, the motor is rotated in a second direction that is opposite to the first direction.

5. The system of claim 4, wherein the voltage regulating module comprises a voltage regulation chip connected to the microcontroller, the voltage regulation chip comprises a first output terminal connected to a first terminal of the motor and a second output terminal connected to a second terminal of the motor.

6. The system of claim 5, wherein the voltage regulating module further comprises a transistor, a base terminal of the transistor is connected to a signal output pin of the microcontroller, a collector terminal of the transistor is connected to a power supply module, and an emitting terminal of the transistor is grounded.

7. The system of claim 6, wherein the collector terminal of the transistor is connected to the power supply module via a first resistor, the base terminal of the transistor is connected to the signal output pin of the microcontroller via a second resistor; and a first input terminal of the voltage regulating module is connected to the collector terminal of the transistor, and a second input terminal of the voltage regulating module is connected to the signal output pin of the microcontroller.

8. The system of claim 7, wherein the load adjusting module comprises a first light emitting diode (LED), a second LED, a third LED, and a fourth LED; the first LED and the fourth LED are connected to the first output terminal of the voltage regulation chip; and the second LED and the third LED are connected to the second output terminal of the voltage regulation chip.

9. The system of claim 8, wherein when the motor is rotated in the first direction, the third LED and the fourth LED are powered on, and the first LED and the second LED is powered off; and when the motor is rotated in the second direction, the first LED and the second LED are powered on, and the third LED and the fourth LED is powered off.

10. The system of claim 1, further comprising a power supply module connected to the input control module, the voltage regulating module, and the load adjusting module; wherein the power supply module comprises a voltage drop module, a bridge rectifier connected to the voltage drop module, and a voltage stabilization chip connected to the bridge rectifier.

11. A system for testing a PSU, comprising:
    an input control module comprising a microcontroller and a plurality of key switches connected to the microcontroller, the microcontroller is configured to receive input instruction from the plurality of key switches and output a first control signal according to the input instruction;
    a voltage regulating module configured to receive the first control signal and generate an output voltage with a voltage value associated with the first control signal;
    a load adjusting module comprising a motor coupled to the output voltage of the voltage regulating module, the motor is rotatable in opposite direction to adjust an output current of the PSU, and a rotating speed of the motor is in direct proportion to the voltage value of the output voltage.

12. The system of claim 11, wherein the plurality of key switches comprises a first key configured to set a first test current of the PSU, a second key switch configured to set a second test current of the PSU, and a third key switch configured to set a third test current of the PSU.

13. The system of claim 12, wherein the plurality of key switches further comprises a reset key switch connected to the microcontroller.

14. The system of claim 13, wherein when one of the first key switch, the second key switch, and the third key switch is activated, the motor is rotated in a first direction; and when the reset key switch is activated, the motor is rotated in a second direction that is opposite to the first direction.

15. The system of claim 14, wherein the voltage regulating module comprises a voltage regulation chip connected to the microcontroller, the voltage regulation chip comprises a first output terminal connected to a first terminal of the motor and a second output terminal connected to a second terminal of the motor.

16. The system of claim 15, wherein the voltage regulating module further comprises a transistor, a base terminal of the transistor is connected to a signal output pin of the microcontroller, a collector terminal of the transistor is connected to a power supply module, an emitting terminal of the transistor is grounded, and the signal output pin of the microcontroller is configured to output a second control signal to switch on or off the transistor.

17. The system of claim 16, wherein the collector terminal of the transistor is connected to the power supply module via a first resistor, the base terminal of the transistor is connected to the signal output pin of the microcontroller via a second resistor; and a first input terminal of the voltage regulating module is connected to the collector terminal of the transistor, and a second input terminal of the voltage regulating module is connected to the signal output pin of the microcontroller.

18. The system of claim 17, wherein the load adjusting module comprises a first LED, a second LED, a third LED, and a fourth LED; the first LED and the fourth LED are connected to the first output terminal of the voltage regulation chip; and the second LED and the third LED are connected to the second output terminal of the voltage regulation chip.

19. The system of claim 18, wherein when the motor is rotated in the first direction, the third LED and the fourth LED are powered on, and the first LED and the second LED is powered off; and when the motor is rotated in the second direction, the first LED and the second LED are powered on, and the third LED and the fourth LED is powered off.

20. The system of claim 11, further comprising a power supply module connected to the input control module, the voltage regulating module, and the load adjusting module; wherein the power supply comprises a voltage drop module, a bridge rectifier connected to the voltage drop module, and a voltage stabilization chip connected to the bridge rectifier.

* * * * *